US008707134B2

(12) United States Patent
Takahashi et al.

(10) Patent No.: US 8,707,134 B2
(45) Date of Patent: Apr. 22, 2014

(54) DATA STORAGE APPARATUS AND APPARATUS AND METHOD FOR CONTROLLING NONVOLATILE MEMORIES

(75) Inventors: Kyosuke Takahashi, Higashiyamato (JP); Motohiro Matsuyama, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 13/314,099

(22) Filed: Dec. 7, 2011

(65) Prior Publication Data

US 2012/0166911 A1 Jun. 28, 2012

(30) Foreign Application Priority Data

Dec. 24, 2010 (JP) ................................ 2010-288829

(51) Int. Cl.
*G11C 29/00* (2006.01)

(52) U.S. Cl.
USPC .......................... 714/763; 714/766; 714/6.24; 714/42; 714/757; 714/758; 714/773; 714/784; 365/185.09

(58) Field of Classification Search
None
See application file for complete search history.

(56) References Cited

U.S. PATENT DOCUMENTS 5,737,344 A 4/1998 Belser et al.
5,809,516 A * 9/1998 Ukai et al. .................... 711/114
6,742,159 B2 5/2004 Sakurai
7,117,421 B1 10/2006 Danilak
7,793,197 B2 9/2010 Ito et al.
2001/0056567 A1 12/2001 Sakurai
2006/0143553 A1 6/2006 Takahashi et al.
2009/0044078 A1* 2/2009 Vogan et al. .................. 714/773
2009/0150748 A1 6/2009 Egner et al.
2009/0307418 A1* 12/2009 Chen et al. .................... 711/105
2009/0327803 A1 12/2009 Fukutomi et al.
2010/0115183 A1 5/2010 Araki et al.
2010/0262755 A1 10/2010 Becker et al.
2011/0066883 A1 3/2011 Dachiku
2012/0166711 A1 6/2012 Matsuyama et al.

FOREIGN PATENT DOCUMENTS

JP H08-321138 12/1996
JP 2002-007225 1/2002
JP 3371044 11/2004
JP 2005-528712 9/2005
JP 2006-190346 7/2006
JP 2007-274239 A 10/2007
JP 2008-508632 3/2008

(Continued)

OTHER PUBLICATIONS

Japanese Office Action dated Jun. 11, 2013 for Japanese Application No. 2010-288830.

(Continued)

*Primary Examiner* — John Trimmings
(74) *Attorney, Agent, or Firm* — Knobbe, Martens, Olson & Bear, LLP

(57) ABSTRACT

According to one embodiment, a data storage apparatus comprises a channel controller, an encoding module, and a data controller. The channel controller configured to control data input and output to and from nonvolatile memories for channels. The encoding module configured to generate encoded data for an interchannel error correction process, using data stored in each of the nonvolatile memories. The data controller configure to manage the encoded data in units of logical blocks when the channel controller writes the encoded data in parallel to the channels, and to allocate parity data contained in the encoded data to planes of the same channel in each logical block.

12 Claims, 10 Drawing Sheets

(56) References Cited

FOREIGN PATENT DOCUMENTS

| | | | |
|---|---|---|---|
| JP | 2010-015195 | | 1/2010 |
| JP | 2010-108246 | A | 5/2010 |
| JP | 2010-250816 | A | 11/2010 |
| JP | 2011-060217 | | 3/2011 |
| WO | WO 03/102965 | A1 | 12/2003 |
| WO | WO 2009/042554 | A1 | 4/2009 |

OTHER PUBLICATIONS

Office Action mailed Jun. 11, 2013 in JP Pat App No 2010-288829.

* cited by examiner

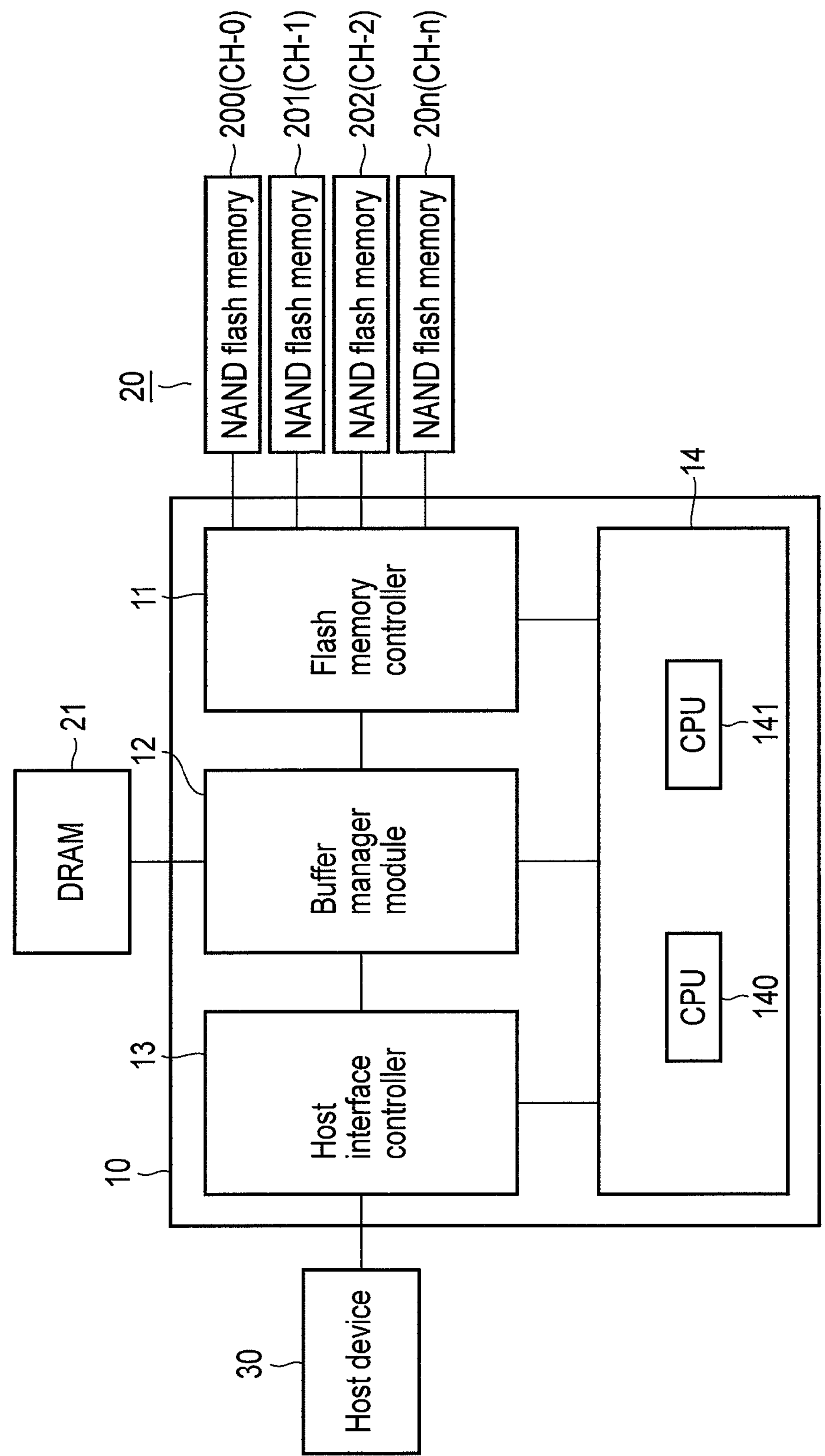
F I G. 1

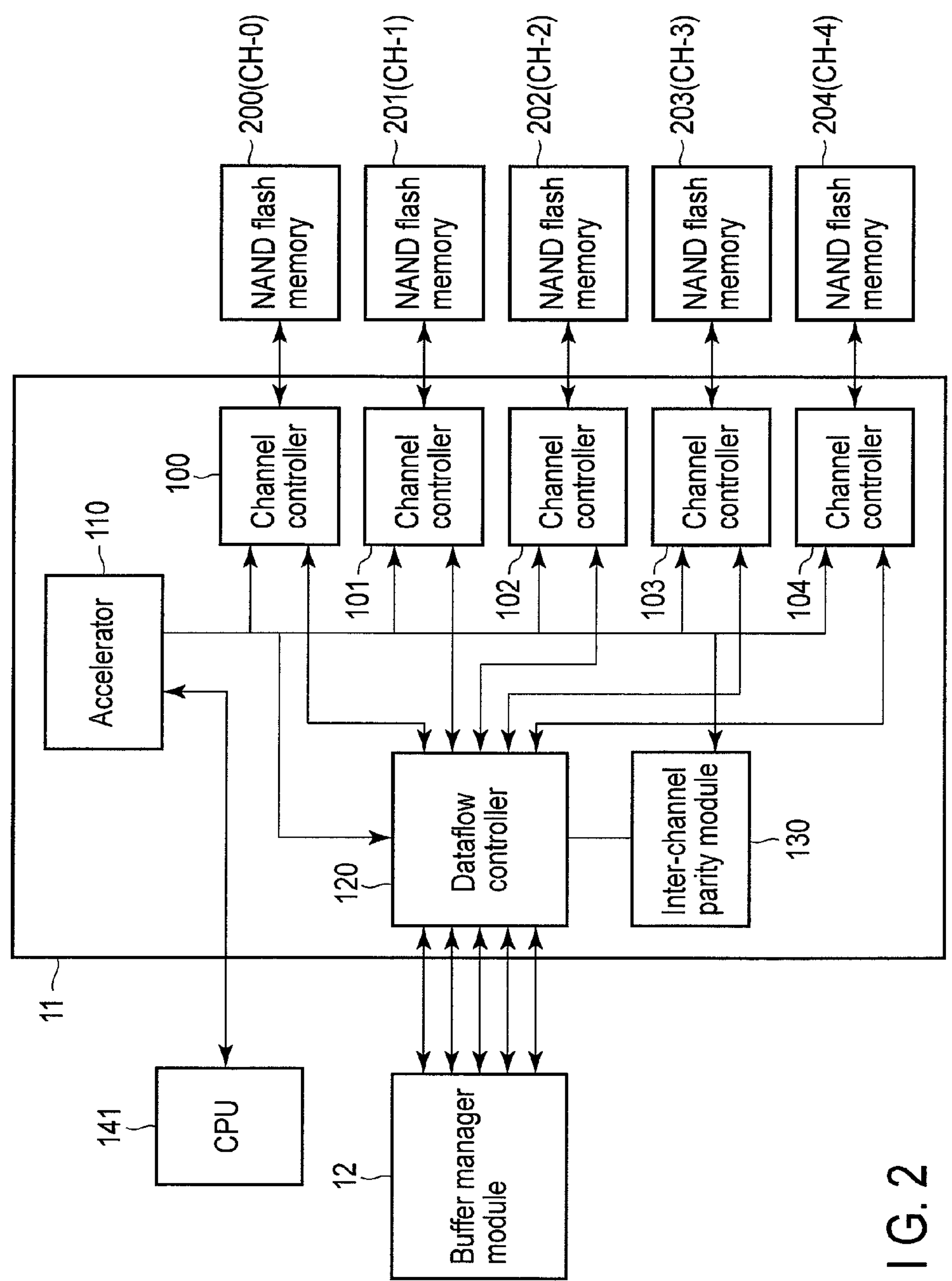
F I G. 2

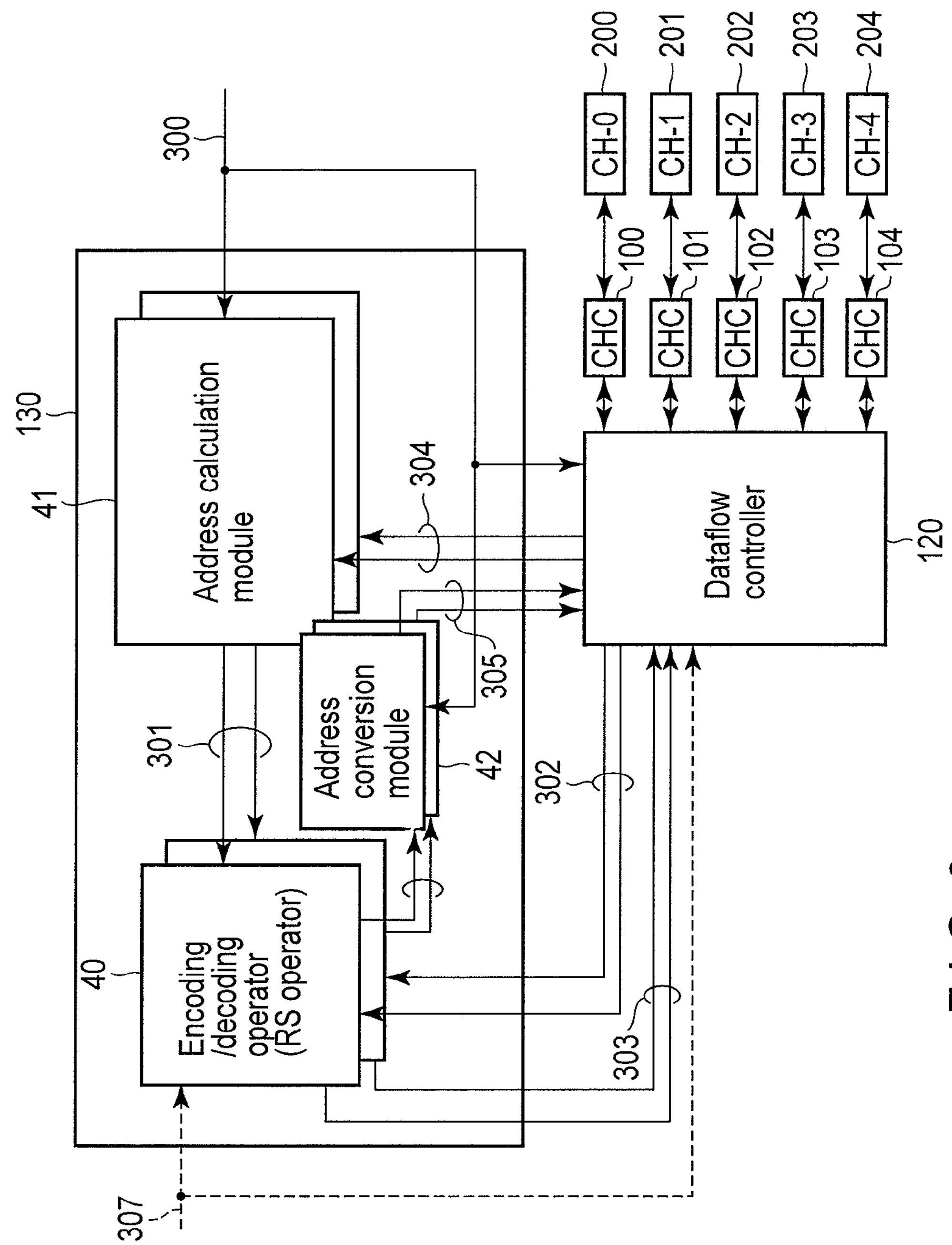
F I G. 3

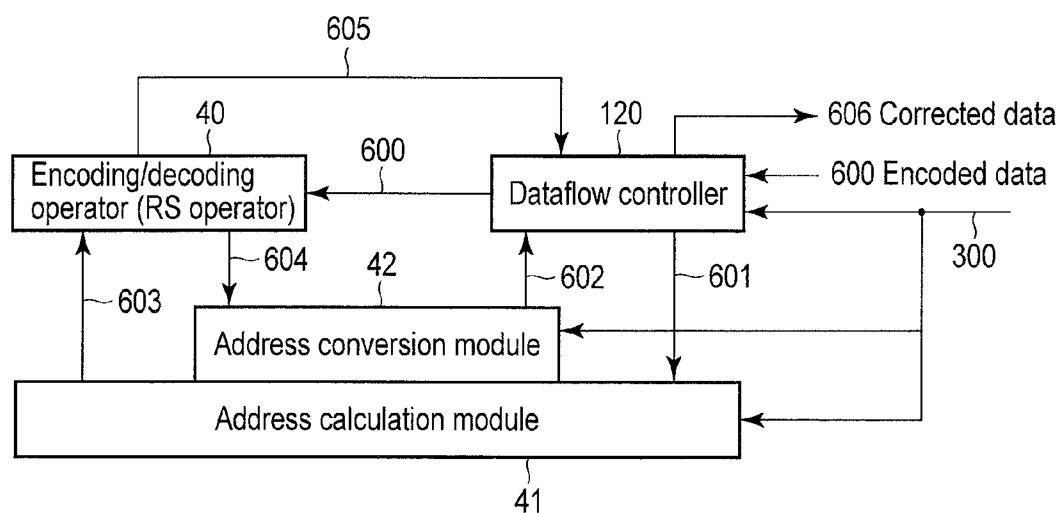
F I G. 6

| Logicalblock | Plane 0 | | | Plane1 | | |
|---|---|---|---|---|---|---|
| CH-0 | 9th degree | | | 5th degree | | |
| CH-1 | 8th degree | | | 4th degree | | |
| CH-2 | 7th degree | | | 3th degree | | |
| CH-4 | 6th degree | | | 2nd degree | | |
| CH-3 | | | | | | |
FIG. 10A
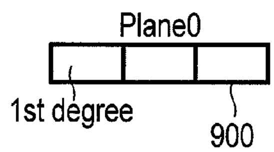
FIG. 10B
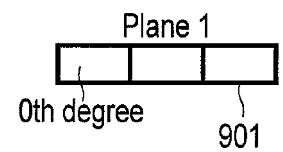
FIG. 10C
| Logicalblock | Plane 0 | | | Plane1 | | |
|---|---|---|---|---|---|---|
| CH-0 | 9th degree | | | 5th degree | | |
| CH-1 | (1st degree) | | | 4th degree | | |
| CH-2 | 8th degree | | | 3th degree | | |
| CH-3 | 7th degree | | | 0th degree | | |
| CH-4 | 6th degree | | | 2nd degree | | |
1100
FIG. 11

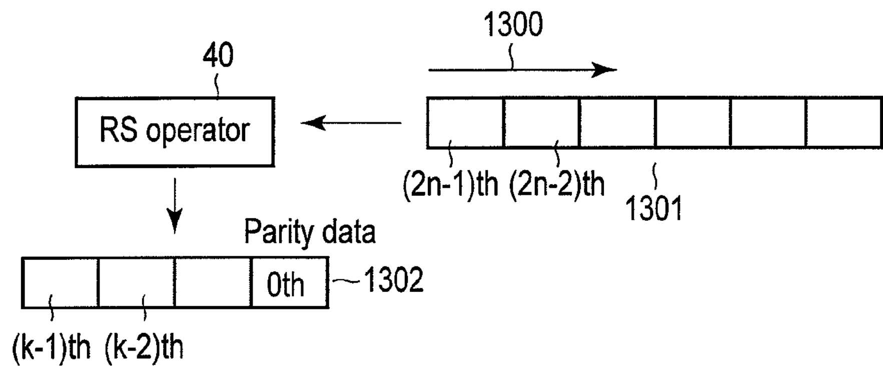
F I G. 1 3
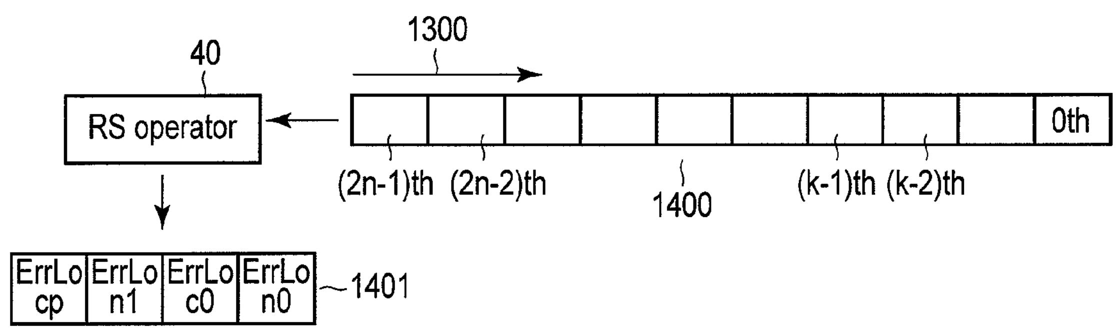
F I G. 1 4
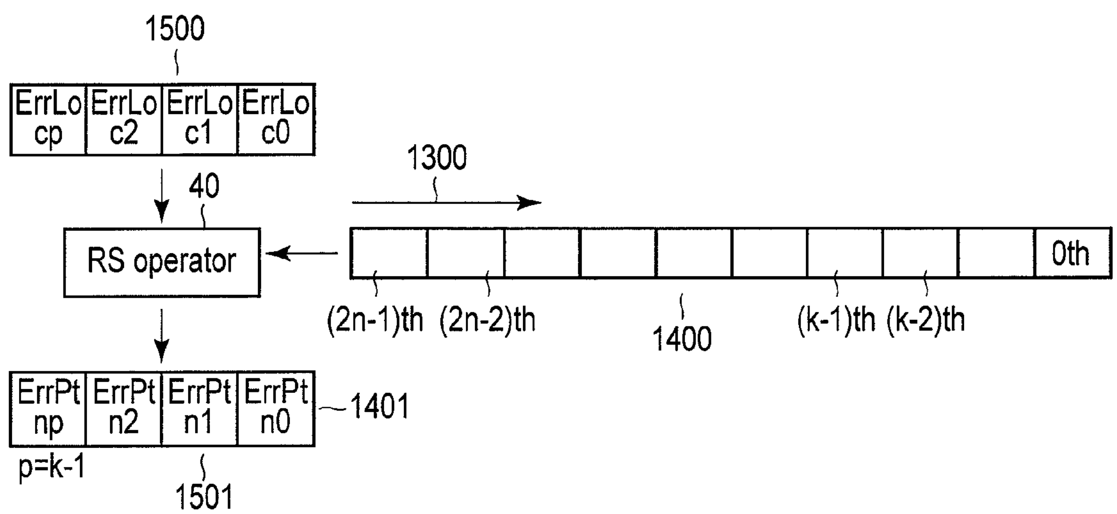
F I G. 1 5

DATA STORAGE APPARATUS AND APPARATUS AND METHOD FOR CONTROLLING NONVOLATILE MEMORIES

CROSS-REFERENCE TO RELATED APPLICATIONS

This application is based upon and claims the benefit of priority from prior Japanese Patent Application No. 2010-288829, filed Dec. 24, 2010, the entire contents of which are incorporated herein by reference.

FIELD

Embodiments described herein relate generally to a data storage apparatus using nonvolatile memories as storage media, and also to apparatus and method for controlling nonvolatile memories.

BACKGROUND

In recent years, solid state drives (SSDs) have been developed as data storage apparatuses, each using NAND flash memories (hereinafter referred to as "flash memories" in some cases) that are rewritable nonvolatile memories.

Most SSDs are of a multichannel type, in which flash memories are managed in units of channels, and data is written to channels in parallel. In any SSD of the multichannel type, the data (user data) to be written in each channel is used, generating error correction codes (i.e., Reed-Solomon codes, hereinafter called "parity data" in some cases), which can perform interchannel parity (ICP) correction process. These error correction codes are stored in the flash memories of some channels selected from the plurality of channels.

In the SSD of the multichannel type, parity data capable of correcting data between the channels is generated and stored in the selected channels. Data to be stored in the flash memories may be managed in the SSD, in the form of logical blocks. The interchannel parity data is therefore allocated to given locations (storage locations) existing in the logical blocks. The method of allocating the interchannel parity data to storage locations may influence the SDD-mounting design, particularly the amounting design of the controller that accomplishes the interchannel parity (ICP) correction function.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram explaining the configuration of a data storage apparatus according to an embodiment;

FIG. 2 is a block diagram explaining the configuration of a flash memory controller according to the embodiment;

FIG. 3 is a block diagram explaining the configuration of an ICP module according to the embodiment;

FIG. 6 is a diagram explaining how data is input and output in a decoding process according to the embodiment;

FIGS. 10A, 10B and 10C are diagrams explaining the interface control for the channels, according to the embodiment;

FIG. 11 is a diagram explaining the data output in a decoding process according to the embodiment;

FIG. 13 is a diagram explaining an encoding process performed by an RS operator according to the embodiment;

FIG. 14 is a diagram explaining a decoding process performed by an RS operator according to the embodiment;

FIG. 15 is a diagram explaining another decoding process performed by an RS operator according to the embodiment;

DETAILED DESCRIPTION

Figure 4A:
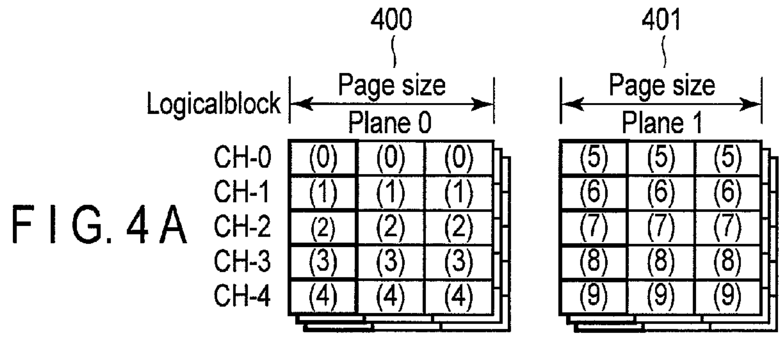
FIGS. 4A and 4B are diagrams explaining a data management method according to the embodiment.

Various embodiments will be described hereinafter with reference to the accompanying drawings.

In general, according to one embodiment, a data storage apparatus comprises a channel controller, an encoding module, and a data controller. The channel controller configured to control data input and output to and from nonvolatile memories for channels. The encoding module configured to generate encoded data for an interchannel error correction process, using data stored in each of the nonvolatile memories. The data controller configure to manage the encoded data in units of logical blocks when the channel controller writes the encoded data in parallel to the channels, and to allocate parity data contained in the encoded data to planes of the same channel in each logical block.

[Configuration of the Data Storage Apparatus]

FIG. 1 is a block diagram explaining the configuration of a data storage apparatus according to an embodiment.

As shown in FIG. 1, the data storage apparatus according to the embodiment is a solid state drive (SSD). The apparatus has an SSD controller 10, NAND flash memories (flash memories) 20, and a buffer memory 21 constituted by a dynamic random access memory (DRAM).

The flash memories 20 are the data storage media used in the SSD, and are flash memory chips. The SSD according to this embodiment is a multichannel type having flash memories 200 to 20*n*, which are associated with channels CH-0 to CH-n, respectively. This embodiment, however, has five flash memories 200 to 204 associated with five channels CH-0 to CH-4, for the same of convenience.

The SSD controller 10 has a flash memory controller 11, a buffer manager module 12, a host interface controller 13, and a subsystem module 14.

The flash memory controller 11 performs a read/write control and a data transfer control on the flash memories 200 to 204 (see FIG. 2). The buffer manager module 12 controls the buffer memory 21, ultimately controlling the data transfer to and from the buffer memory 21. The buffer memory 21 temporarily stores the data to be written in the flash memories 200 to 204 and the data read from the flash memories 200 to 204. The buffer memory 21 stores the statistical data representing the number of time each flash memory has been accessed, and the address conversion data for managing the data stored in the flash memories 200 to 204.

The host interface controller 13 controls the transfer of data and commands between the SSD and a host device 30. The host device 30 is, for example, the interface controller of the Serial ATA (SATA) standard incorporated in a personal computer.

The subsystem module 14 has a first microprocessor (CPU) 140 and a second microprocessor (CPU) 141, and controls the other components of the SSD controller 10. The first CPU 140 controls the buffer manager module 12 and host interface controller 13. The second CPU 141 controls the flash memory controller 11 and buffer manager module 12, causing them to execute commands coming from the host device 30, thereby writing and reading data to or from the flash memories 200 to 204.

(Configuration of the Flash Memory Controller)

As shown in FIG. 2, the flash memory controller 11 includes channel controllers 100 to 104, an input/output per second (IOPS) accelerator (hereinafter called an "accelerator") 110, a dataflow controller 120, and an interchannel parity module 130. The channel controllers 100 to 104 are associated with channels CH-0 to CH-4, respectively.

The accelerator 110 is a main controller for controlling the channel controllers 100 to 104, dataflow controller 120 and interchannel parity module 130 and also for controlling the data transfer to and from them. The accelerator 110 further controls a command process, in cooperation with the firmware (i.e., CPU 141).

The channel controllers 100 to 104 control the interface (i.e., data transfer) with the flash memories 200 to 204 associated with channels CH-0 to CH-4, respectively. That is, the flash memory controller 11 is configured to control the flash memories 200 to 2004 that the channel controllers 100 to 104 control in parallel for channels CH-0 to CH-4, respectively.

The dataflow controller 120 controls the data transfer between the channel controllers 100 to 104 and the interchannel parity module 130. Further, the dataflow controller 120 controls the data transfer between the channel controllers 100 to 104 and the buffer manager module 12. The interchannel parity module 130 is a data protection module configured to perform an interchannel parity (ICP) error correction process if errors are made, as will be described later. Hereinafter, the interchannel parity module 130 may be referred to as "ICP module 130" in some cases.

As shown in FIG. 3, the ICP module 130 has an encoding/decoding operator 40, an address calculation module 41, and an address conversion module 42. In this embodiment, the encoding/decoding operator (hereinafter called "RS operator") 40 encodes data in the Reed-Solomon encoding method, and decodes Reed-Solomon codes. As described later, the RS operator 40 performs an encoding process, thereby generating parity data, and performs a decoding process, generating correction data 302.

The data stored in each of the flash memories 200 to 204 associated with channels CH-0 to CH-4, respectively, contains ECC data. The channel controllers 100 to 104 perform an ECC process, thereby protecting the data items stored in the flash memories 200 to 204. The ICP module 130 according to this embodiment combines the data items for different channels and generates encoded data, thereby accomplishing the interchannel data protection. The RS operator 40 is constituted by a plurality of operators in order to process data at high speed and configured to perform a pipeline parallel process. Alternatively, the RS operator 40 may be constituted by an operator that processes data in units of several bytes.

(InterChannel Parity (ICP) Process)

The ICP process (i.e., interchannel data protection process) will be explained with reference to FIG. 3 to FIG. 17.

Figure 4B:
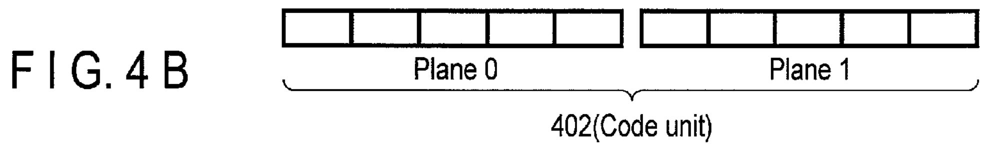

FIGS. 4A and 4B are diagrams explaining a data management method according to the embodiment. In this embodiment, the flash memory controller 11 manages, in units of logical blocks, the data to transfer via the channel controllers 100 to 104 to the flash memories 200 to 204 associated with channels CH-0 to CH-4, respectively.

As shown in FIG. 4A, the logical blocks according to this embodiment are defined by channels CH-0 to CH-4, planes and logical pages. The planes are units of region, to which the storage areas for channels CH-0 to CH-4 (i.e., flash memories 200 to 204) are allocated. In this embodiment, the data managed in the respective channels CH-0 to CH-4 is divided into two planes (i.e., Plane 0 and Plane 1). The logical pages (i.e., page sizes 400 and 401) are matrices of channels CH-0 to CH-4 and two planes (Plane 0 and Plane 1). Hereinafter, Plane 0 will be referred to as "plane 0," and Plane 1 will be referred to as "plane 1."

Each logical block is constituted by a plurality of logical pages. In the present embodiment, the matrix elements of each plane are, for example, one-byte data items. The ICP module 130 generates encoded data 402 is a data unit in the interchannel ECC process (i.e., data unit to be protected). As shown in FIG. 4B, the encoded data 402 is a combination of two one-byte data items extracted from the planes 0 and 1 for one channel (CH-0, CH-1, CH-2, CH-3 or CH-4). This encoding (data protection) is performed on all logical blocks.

Figure 5A:
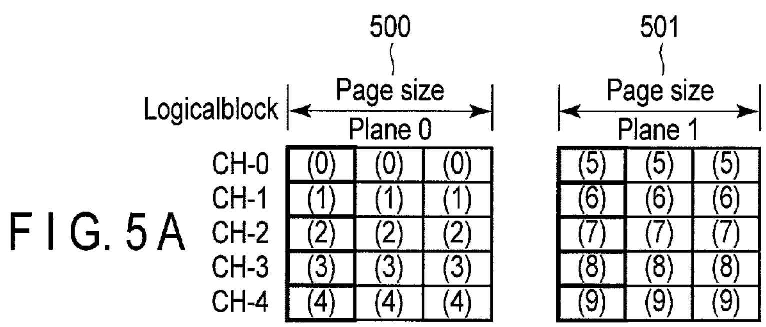
FIGS. 5A and 5B are diagrams outlining a method of managing encoded data containing the parity data according to the embodiment.

In the present embodiment, one logical page (page sizes 500 and 501) is regarded as constituting one logical block, for the same of convenience, as shown in FIG. 5A. Hence, the logical pages will be hereinafter described as identical to logical blocks.

The ICP process (i.e., data protection process), more precisely the encoding process and decoding process, will be explained with reference to the flowcharts of FIGS. 16 and 17.

First, the flash memory controller 11 processes the planes 0 and 1 of each of channels CH-0 to CH-4, in order to make accesses to the flash memories 200 to 204. To process a write command, the controller 11 combines the planes 0 and 1, as one request unit (i.e., one write command). This write process, which is known as "multiplane write," can increase the write process (or shortens the programming time).

Figure 16:
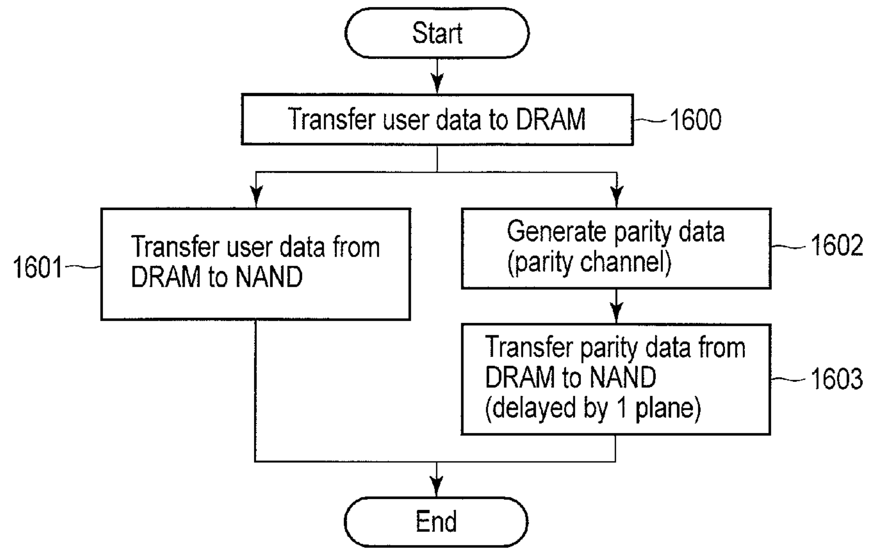
FIG. 16 is a flowchart explaining an ICP process according to the embodiment.

As shown in the flowchart of FIG. 16, user data is transferred from the host interface controller 13 (hereinafter called "SAS" in some cases) to the buffer memory 21 (Block 1600). The flash memory controller 11 transfers the user data from the buffer memory 21 to the flash memories associated with all channels, except the channel storing parity data, thereby writing the user data in the flash memories (Block 1601).

Figure 5B:
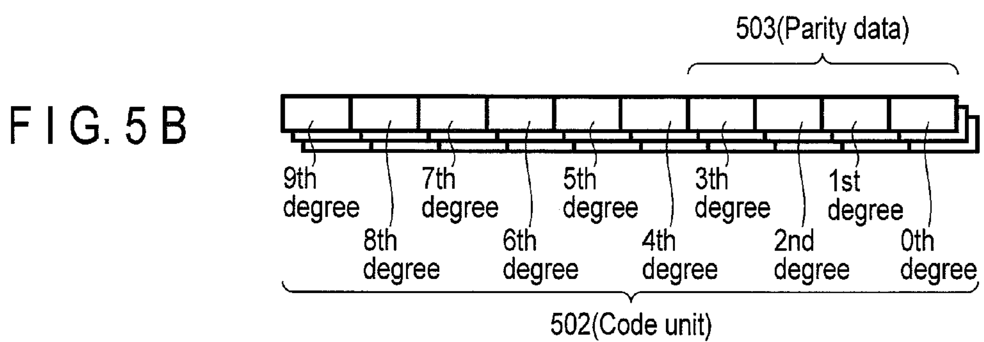

Then, the ICP module 130 performs an encoding process, generating encoded data 502 as shown in FIG. 5B. In the encoding process, the ICP module 130 prepares write data, in units of logical pages (logical blocks), and inputs the write data to the RS operator 40. The RS operator 40 generates parity data (Block 1602).

As shown in FIG. 3, the dataflow controller 120 transfers, to the RS operator 40, the write data (source data) that the channel controllers 100 to 104 have read from the flash memories 200 to 204. Further, the dataflow controller 120 transfers the parity data generated by the RS operator 40, to any one of the channel controllers 100 to 104 (Block 1603). The channel controllers 100 to 104 perform a write process on both the parity data and the source data, in units of logical pages.

FIG. 13 is a diagram explaining the encoding process performed by the RS operator 40. The RS operator 40 performs RS encoding. More specifically, the RS operator 40 generates k-byte parity data 1302 if source data 1301 of 2n-k bytes, having code length of 2n, is input in the order of arrow 1300.

FIG. 14 is a diagram explaining the decoding process (later described) performed by the RS operator 40. As shown in FIG. 14, the parity data items 1302 are arranged in the source data 1301, and the degrees of an encoded polynomial are allocated to the parity data items. As a result, encoded data 1400 is generated.

The present embodiment is based on the assumption that the storage location of a logical page that contains the parity data generated in the encoding process is designated in units of planes. That is, this embodiment proposes a method of managing data, in which the parity data used in the interchannel parity process (data protection) is managed in a logical block in a specific manner.

Figure 7A:
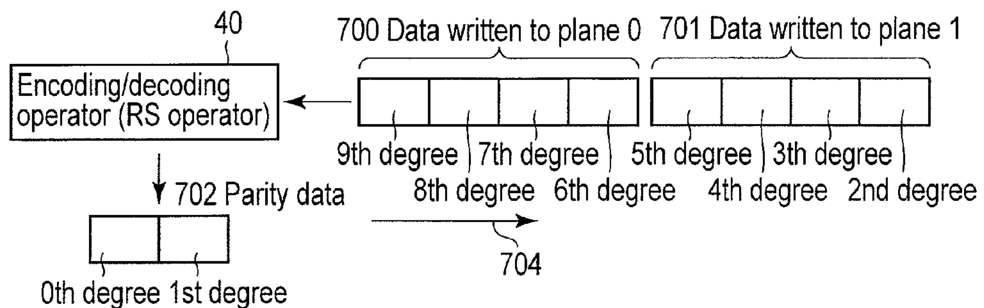
FIGS. 7A and 7B are diagrams explaining the encoding process according to the embodiment.

The encoding process according to the embodiment will be explained in detail, with reference to FIGS. 7A and 7B.

Assume that the encoded data has a code length of 10 bytes in the present embodiment. Then, two bytes of the encoded data is parity data 702. In order to encode data, the source data 700 of the plane 0 and the source data 702 of the plane 1 are input to the RS operator 40 as shown in FIG. 7A. The RS operator 40 generates parity data 702 from the source data items 700 and 701.

Figure 7B:
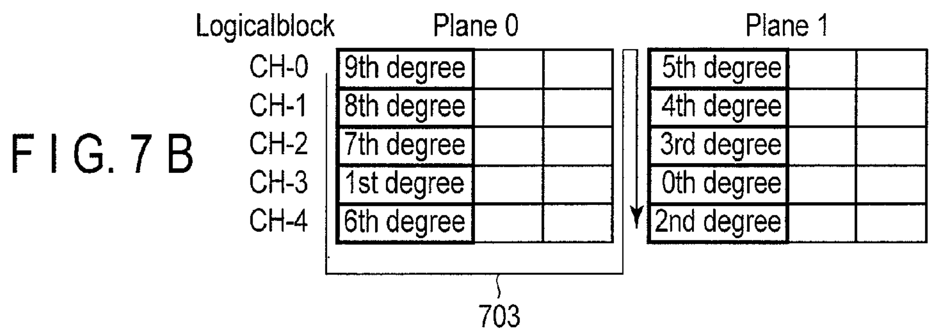

Next, the channel controllers 100 to 104 store the source data items 700 and 701 and the parity data 702 thus generated, in mutual association as shown in FIG. 7B, in the planes 0 and 1 of the logical block. In this case, the parity data 702 is stored, as the same number of bytes, in the planes 0 and 1 of the same channel, e.g., channel CH-3, in the present embodiment.

To be more specific, as shown in FIG. 7B, storage locations are allocated, during the encoding process, to the encoded data items, first to the data item of the highest degree, in the descending order of channels, staring with the plane 0 in the logical block. At this point, the storage in the channel number (i.e., CH-3) designated as the storage site for the parity data is skipped for some time. After the parity data is completely prepared, it is stored in the channel designated as storage site. That is, during the encoding process according to this embodiment, the ICP module 130 generates encoded data in which the source data and the parity data are associated in a logical block. At this time, the parity data undergoes data management, in which it is stored in the planes 0 and 1 of the same channel CH-3, as the same number of bytes.

FIGS. 9A, 9B and 9C and FIGS. 10A, 10B and 10C are diagrams explaining tow different interface controls the channel controllers 100 to 104 may perform during the encoding process.

Figures 9A, 9B, 9C:
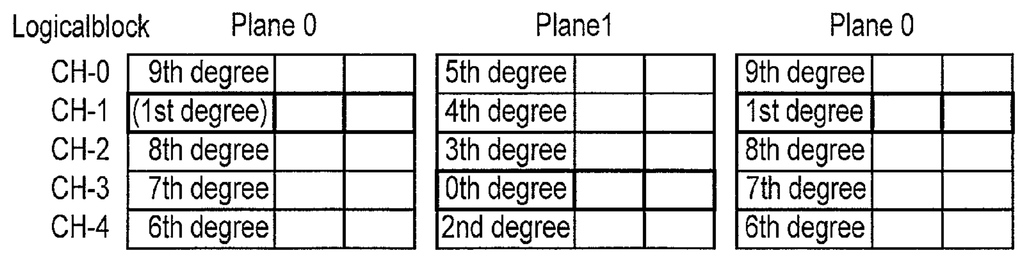
FIGS. 9A, 9B and 9C are diagrams explaining an interface control for the channels, according to the embodiment.

More precisely, FIGS. 9A, 9B and 9C show a method of storing the parity data in a channel other than the designated channel, unlike in the data management method described above. That is, as shown in FIG. 9A, the channel controllers 100 to 104 write, in phase 0, the source data 700 of any channel other than channel CH-1. Next, as shown in FIG. 9B, the channel controllers 100 to 104 write, in phase 1, the parity data (0th degree) in the plane 1 of channel CH-3, and write the source data in the plane 1 of any other channel. Moreover, as shown in FIG. 9C, the channel controllers 100 to 104 write, in phase 2, the parity data (first degree) in the plane 0 of channel CH-1.

In such a data management method, wherein the parity data is stored in different channels and then managed, however, the dataflow process performed in units of planes 0 and 1 cannot preserve its uniformity when the source data items 700 and 701 to be encoded are input to the RS operator 40. Further, in the process of writing data in units of channels, too, the order of processing data in units of planes 0 and 1 must be changed for every channel.

By contrast, in the data management method according to this embodiment, the channel controllers 100 to 104 write, in phase 0, the source data 700 in the plane 0 of each channel other than channel CH-3 designated as one for the parity data, as shown in FIG. 10A. Next, as shown in FIG. 10B, the channel controllers 100 to 104 write, in phase 1, the parity data (first degree) in the plane 0 of channel CH-3, and write the source data 701 in the plane 1 of any other channel. Then, as shown in FIG. 10C, the channel controllers 100 to 104 write, in phase 2, the parity data (0th degree) in the plane 1 of channel CH-3.

In the data management method according to this embodiment, the logical blocks are thus managed to store the parity data, in the same number of bytes, in the planes 0 and 1 of the same channel CH-3. Data can therefore be uniformly processed in units of channels and in units of planes. More specifically, the process of inputting data to the RS operator 40 and the process of writing encoding data (i.e., source data and parity data) can be uniformly performed during the encoding process and the decoding process (described later).

This renders it easy to arrange the accelerator 110 and channel controllers 100 to 104, in particular, in the flash memory controller 11. In addition, this can simplify the multiplane write process.

(Decoding Process)

Figure 17:
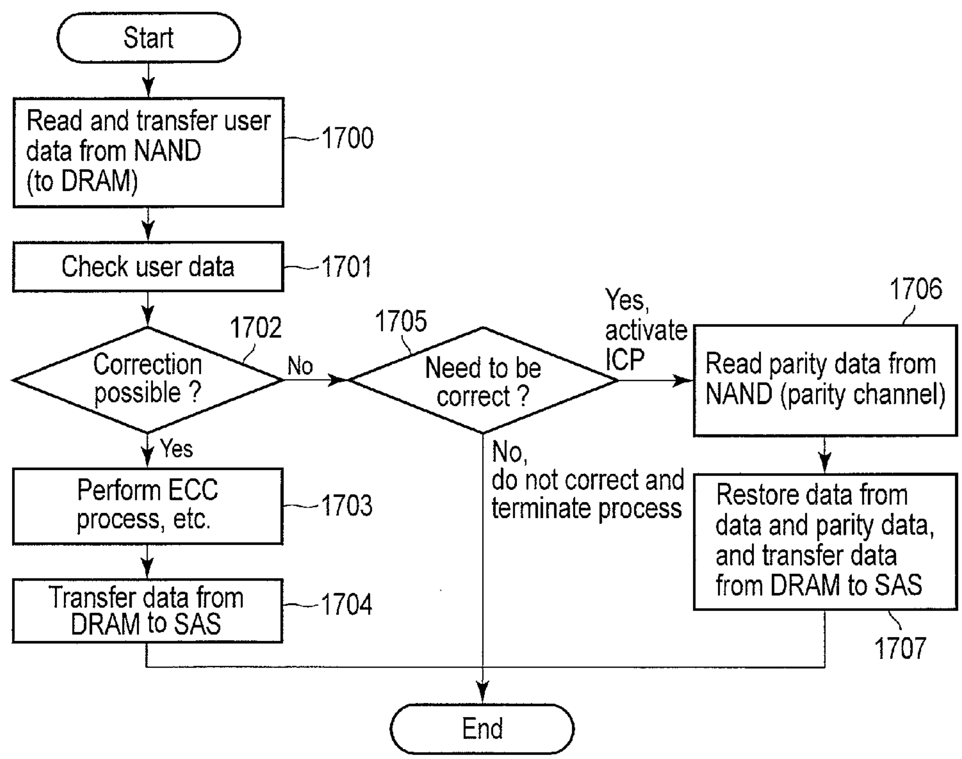
FIG. 17 is a flowchart explaining another ICP process according to the embodiment.

As shown in the flowchart of FIG. 17, the flash memory controller 11 reads user data from the flash memory of each channel and transfers the user data to the buffer memory 21 during the read process (Block 1700). At this point, the flash memory controller 11 uses ECC, checking the user data that has been read (Block 1701). If the user data can be corrected (YES in Block 1702), the flash memory controller 11 performs uses the ECC, correcting the user data (Block 1703). The user data corrected by using the ECC is transferred from the buffer memory 21 to the host interface controller 13 (Block 1704).

If the channel controllers 100 to 104 detects errors while the data is being accessed (NO in Block 1702) and if the ECC can no longer corrects errors (YES in Block 1705) and the data should therefore be restored, the flash memory controller 11 causes the ICP module 130 to perform the interchannel parity (ICP) process.

The ICP module 130 uses the parity data read from the flash memory (Block 1706) and then performs a decoding process (i.e., data restoring process) (Block 1707).

How the decoding process is performed in the method of managing the encoded data (i.e., source data and parity data) generated in the encoding process according to this embodiment will be explained with reference mainly to FIG. 3 and FIG. 6.

First, as shown in FIG. 6, the dataflow controller 120 transfers encoded data 600 read from the flash memories 200 to 204, to the RS operator 40 through the channel controllers 100 to 104. At this time, the dataflow controller 120 sequentially reads data from the logical blocks managed, for the respective channels CH-0 to CH-4, in the descending order of degree as is illustrated in FIG. 7B (see arrow 703).

Figure 8:
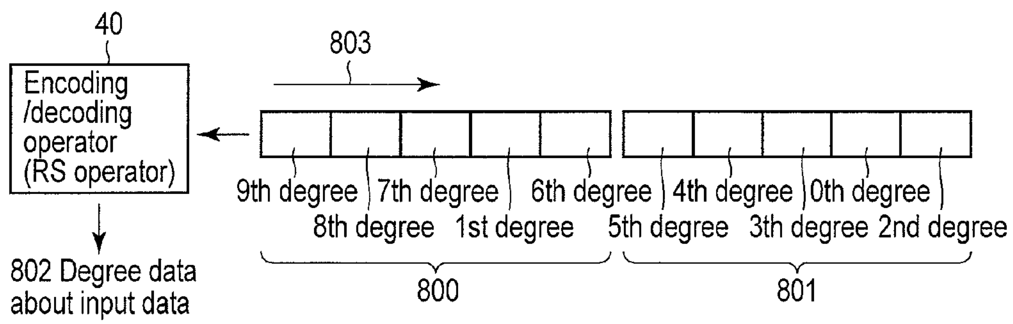
FIG. 8 is a diagram explaining the decoding process according to the embodiment.

Hence, as shown in FIG. 8, the encoded data consisting of data items 800 and 801 read for each of channels CH-0 to CH-4 is input to the RS operator 40 in the order of arrow 803 during the decoding process. The RS operator 40 acquires the location data (301 and 603) about the encoded data, because the input data consisting of the source data and parity data contains degree data 802 (i.e., data representing the order).

FIG. 14 is a diagram explaining the decoding process performed by the RS operator 40. The RS operator 40 performs the decoding process as encoded data 1400 is input to it in the order of arrow 1300 as shown in FIG. 14. If the encoded data 1400 contains errors, the RS operator 40 outputs error correction data 1401 that contains error locations (ErrLo) and an error pattern (ErrPt).

More precisely, as shown in FIG. 3 and FIG. 6, the RS operator 40 outputs error correction data (303 and 605) containing the error locations and error pattern, to the dataflow controller 120. The dataflow controller 120 transfers data 606, detected to have errors, and corrected by using the error correction data and now free of errors, to the buffer manager module 12 (Block 1707). In other words, the dataflow controller 120 transfers the corrected data 606 to the channel controllers 100 to 104 during the write process. During the read process, the dataflow controller 120 transfers the corrected data 606 to the buffer manager module 12. The buffer manager module 12 transfers the buffer manager module 12 via the buffer memory 21 to the host interface controller 13.

FIG. 15 is a diagram explaining another decoding process related to erasure correction. If the RS operator 40 receives error location data 1500 specifying the error locations, prior to the decoding process, it uses the error location data 1500 as preliminary data in the decoding process. To be more specific, on receiving error location data 307 from, for example, the CPU 141 as shown in FIG. 3, the RF operator 40 uses this data 307 as preliminary data in the decoding process. In this case, the RS operator 40 need not perform calculate the error locations. The RS operator 40 can therefore output error correction data (303 and 605) at high speed.

As described above, the flash memory controller 11 according to this embodiment manages data in units of logical blocks defined by channels CH-0 to CH-4 and planes 0 and 1, and processes the planes 0 and 1 as smallest units of data. During the decoding process, the ICP module 130 performs the ICP error correction process, in units of encoded data items, over channels CH-0 to CH-4. Therefore, the ICP module 130 must associate the location data items (i.e., channel numbers CH-0 to CH-4 and plane numbers 0 and 1) with the degrees of encoded data items (i.e., order).

In this embodiment, the dataflow controller 120 performs a control during the encoding process as described above, thereby associating the order of inputting data items to the RS operator 40 with the channel numbers to which the encoded data items are allocated and in which they are stored. The channel controllers 100 to 104 allocate the encoded data items to, and store them in the respective channels of the logical block.

In order to associate the location data contained in the logical block with the degree of the encoded data during the decoding process, the ICP module 130 has the address calculation module 41 and address conversion module 42 as shown in FIG. 3 and FIG. 6. How the ICP module 130 operates will be explained in detail, with reference to FIG. 11 and FIG. 12.

As shown in FIG. 11, the data items allocated by the channel controllers 100 to 104 from the plane 0 of the logical block, in the descending order of channel numbers CH-0 to CH-4, are sequentially read in the decoding process (see arrow 1100). The dataflow controller 120 transfers these data items (i.e., encoded data 600) to the RS operator 40 as shown in FIG. 6. In this case, the parity data (i.e., the data for channel CH-3) does not need be so handled as in the encoding process. Nonetheless, the data items are input to the RS operator 40 in the order of arrow 1203 shown in FIG. 112. As a result, the relation between the order of encoded data items 1200 and 1201 and the degree of data is jeopardized. Degree data (301, 603) representing the degree of the input data (i.e., encoded data) must therefore be input, as attribute data, to the RS operator 40.

As shown in FIG. 3 and FIG. 6, the degree data (301, 603) is input to the RS operator 40 by the address calculation module 41. The address calculation module 41 receives storage location data 300 about the parity data. The storage location data 300 represents the number (CH-3) of the channel and plane number, to which the parity data contained in the logical block is addressed.

Figure 12:
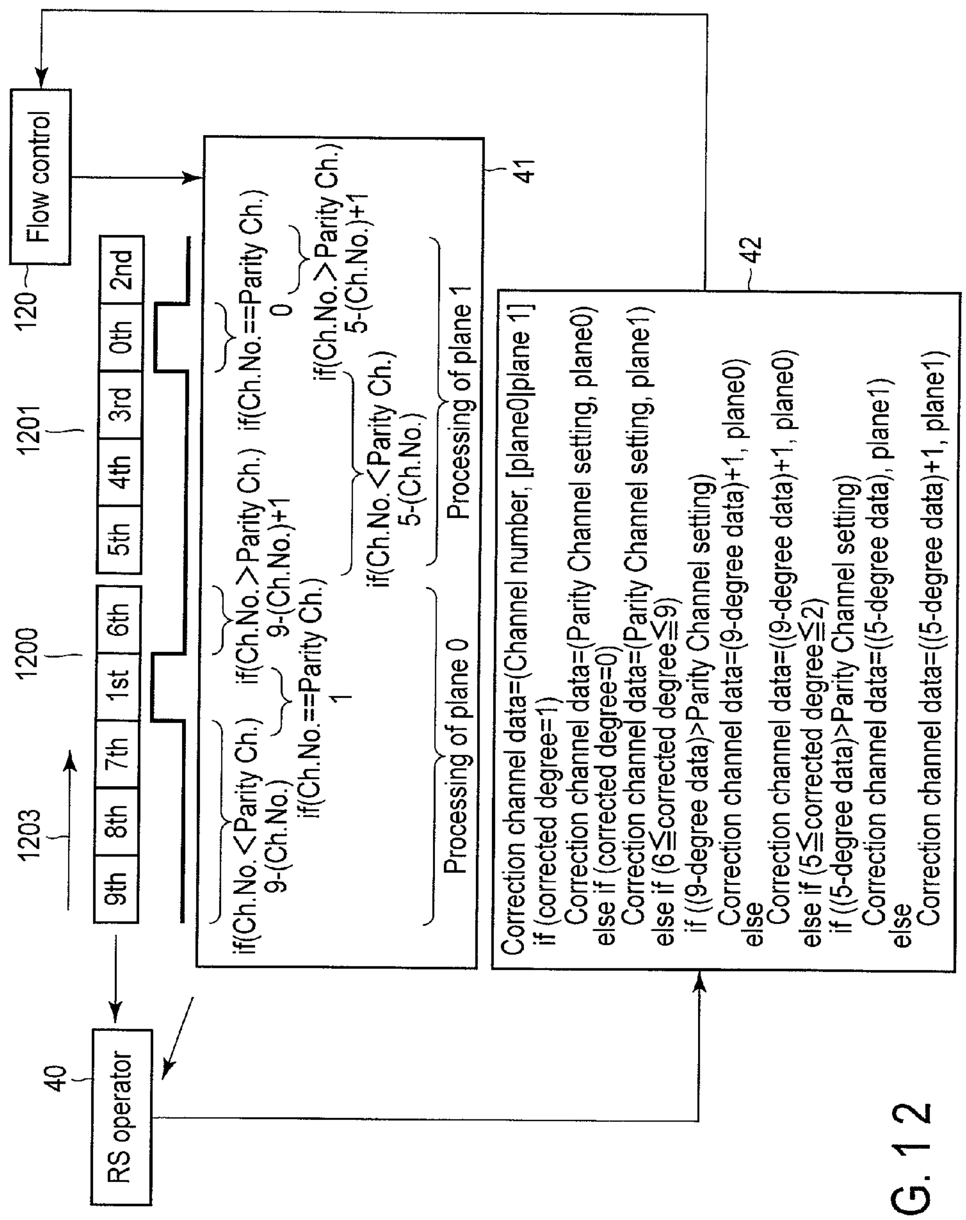
FIG. 12 is a diagram explaining a decoding process according to the embodiment.

The address calculation module 41 performs such address calculation as shown in FIG. 12, obtaining, as degree data (301, 603), the location data (Fn) contained in the encoded data. More specifically, the address calculation module 41 receives the channel number of the input data and the location data (304, 601) contained in the logical block and representing the channel number and plane number of the data input to the RS operator 40. That is, the address calculation module 41 inputs, to the RS operator 40, the location data (Fn) representing the channel number and plane number of the input data and also the location data representing the channel number and plane number of the channel in which the parity data should be stored.

As described above, the RS operator 40 associates the order of the encoded data items with the degrees thereof, on the basis of the location data (301, 603) received from the address calculation module 41, thereby detecting and correcting the errors contained in the encoded data. The RS operator 40 outputs the error correction data (303 and 605), which is the result of the decoding process, to the dataflow controller 120.

In accordance with the error correction data (605) output from the RS operator 40, the dataflow controller 120 outputs correction data 606. An interchannel data correction can thereby be achieved in the decoding process during the interchannel parity process, by reading all data from the logical block and transferring the data to the RS operator 40.

In order to output the corrected data 606, the dataflow controller 120 needs corrected location data (Fn^−1) that associates the error location data obtained by the RS operator 40 with the corrected location data contained in the logical block. The corrected location data can be generated by the address conversion module 42 as shown in FIG. 3 and FIG. 6.

The address conversion module 42 performs such address conversion as shown in FIG. 12, generating corrected location data that represents corrected channel number (305) and corrected plane number (602). The corrected location data is output to the dataflow controller 120. The address conversion module 42 can easily generate the corrected location data by using the information set in the parity-storing channel as shown in FIG. 12, because the order of the numbers of the logical blocks the dataflow controller 120 executes are associated with the degrees of the encoded data items.

As indicated above, the ECC process may be performed for each channel. Then, an erasure correction can be accomplished to generate error location data (307) in the interchannel parity process according to this embodiment. In this case, the address calculation module 41 can convert the plane location represented by the error location (307) to the degree data contained in the code. The address conversion module 42 can therefore be dispensed with.

As has been described, in the SSD according to this embodiment, the ICP module 130 performs an encoding process, generating encoded data wherein the source data and the parity data are associated in the logical block. The parity data is managed, storing bytes in the same number in the planes 0 and 1 of the same channel (i.e., CH-3 in this instance). As a result, the data processing in units of channels and the data processing in units of planes can be uniformly performed. More specifically, the data input and the encoded data write, both to the RS operator 40, can be uniformly accomplished during the encoding process and decoding process.

This can simplify not only the mounting design in the flash memory controller 11, particularly that of the accelerator 110 and channel controllers 100 to 104, but also the multiplane write process. In other words, it is possible to simplify the dataflow control achieved by the dataflow controller 120 and the pipeline process management achieved by a plurality of RS operators to accomplish a high-speed operation in the ECC process. The parallel operation of RS operators can thereby be easily performed, ultimately reducing the cost of mounting components. In brief, the present embodiment can simplify the mounting design of a controller that implements the ICP function.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage apparatus comprising:

channel controllers configured to control data input to and output from a plurality of nonvolatile memories, each nonvolatile memory associated with one of a plurality of channels;

an encoder configured to generate encoded data for an interchannel error correction process, using data stored in each of the nonvolatile memories; and a data controller configured to manage the encoded data in units of logical blocks when the channel controllers write the encoded data in parallel to the channels, and to allocate, for each logical block, parity data contained in the encoded data to planes of a select one of the plurality of channels, wherein the data controller is configured to allocate a same amount of data to the planes of the select channel in each logical block.

2. The data storage apparatus of claim 1, further comprising a decoder configured to perform an error detection and correction process on the encoded data read from the channel controllers.

3. The data storage apparatus of claim 2, wherein the decoder is configured to receive location data containing a channel number and a plane number that indicate positional relation between the logical block and the encoded data, while receiving the encoded data transferred from the data controller in the error detection/correction process.

4. The data storage apparatus of claim 1, wherein the data controller is configured to associate source data, from which the encoded data is generated, with degree data and location data, both contained in the parity data, and to allocate the source data, in a logical block, to planes of channels other than the channel storing the parity data.

5. A memory control apparatus for use in a data storage apparatus comprising:

channel controllers configured to control data input to and output from a plurality of nonvolatile memories, each nonvolatile memory associated with one of a plurality of channels;

an encoder configured to generate encoded data for an interchannel error correction process, using data stored in each of the nonvolatile memories; and a data controller configured to manage the encoded data in units of logical blocks when the channel controllers write the encoded data in parallel to the channels, and to allocate, for each logical block, parity data contained in the encoded data to planes of a select one of the plurality of channels, wherein the data controller is configured to allocate a same amount of data to the planes of the select channel in each logical block.

6. The memory control apparatus of claim 5, further comprising a decoder module configured to perform an error detection and correction process on the encoded data read from the channel controllers.

7. The memory control apparatus of claim 6, wherein the decoder is configured to receive location data containing a channel number and a plane number that indicate positional relation between the logical block and the encoded data, while receiving the encoded data transferred from the data controller in the error detection/correction process.

8. The memory control apparatus of claim 5, wherein the data controller is configured to associate source data, from which the encoded data is generated, with degree data and location data, both contained in the parity data, and to allocate the source data, in a logical block, to planes of channels other than the channel storing the parity data.

9. A method of controlling memories, for use in a data storage apparatus comprising a plurality of nonvolatile memories associated with a plurality of channels, the method comprising:

generating encoded data for an interchannel error correction process using data stored in each of the nonvolatile memories;

managing the encoded data in units of logical blocks when a plurality of channel controllers write the encoded data in parallel to the channels, and allocating, for each logical block, parity data contained in the encoded data to planes of a select one of the plurality of channels; and allocating a same amount of data to the planes of the select channel in each logical block.

10. The method of claim 9, further comprising performing an error detection and correction process on the encoded data read from the channels.

11. The method of claim 10, further comprising receiving location data containing a channel number and a plane number that indicate positional relation between the logical block and the encoded data, while receiving the encoded data transferred from the channels in the error detection/correction process.

12. The method of claim 9, further comprising:

associating source data, from which the encoded data is generated, with degree data and location data, both contained in the parity data; and allocating the source data, in a logical block, to planes of channels other than the channel storing the parity data.

* * * * *